United States Patent
Li (10) Patent No.: US 8,007,080 B2
(45) Date of Patent: Aug. 30, 2011

(54) ACTUATOR DEVICE, METHOD OF MANUFACTURING THE SAME AND LIQUID-JET HEAD

(75) Inventor: Xin-Shan Li, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 471 days.

(21) Appl. No.: 12/166,943

(22) Filed: Jul. 2, 2008

(65) Prior Publication Data

US 2009/0201337 A1    Aug. 13, 2009

(30) Foreign Application Priority Data

Jul. 5, 2007  (JP) ................................ 2007-176996
Jun. 30, 2008  (JP) ................................ 2008-169799

(51) Int. Cl.
*B41J 2/045* (2006.01)
*H01L 41/09* (2006.01)

(52) U.S. Cl. ......................................... 347/68; 310/320
(58) Field of Classification Search .................... 347/68, 347/70–72; 310/320, 328
See application file for complete search history.

(56) References Cited

U.S. PATENT DOCUMENTS

| 5,933,167 A | * | 8/1999 | Shimada et al. | ................. 347/70 |
| 6,923,528 B2 | * | 8/2005 | Shimada | ......................... 347/68 |

FOREIGN PATENT DOCUMENTS

| JP | 2003-110158 | 4/2003 |
| JP | 2005-166719 | 6/2005 |
| JP | 2005-295786 | 10/2005 |

* cited by examiner

*Primary Examiner* — An H Do
(74) *Attorney, Agent, or Firm* — Workman Nydegger (57) ABSTRACT

Provided is an actuator device including a piezoelectric element formed of a lower electrode, a piezoelectric layer, and an upper electrode, and displaceably provided on a substrate with a zirconium oxide layer interposed therebetween, the substrate having a silicon oxide layer formed by thermal oxidation on at least a surface, and an intermediate layer made of at least one material selected from the group consisting of titanium oxide, hafnium oxide, aluminum oxide, calcium oxide, and rare earth oxide, and provided between the silicon oxide layer and the zirconium oxide layer.

8 Claims, 7 Drawing Sheets

ACTUATOR DEVICE, METHOD OF MANUFACTURING THE SAME AND LIQUID-JET HEAD

The entire disclosures of Japanese Patent Applications Nos. 2007-176996 filed Jul. 5, 2007 and 2008-169799 filed Jun. 30, 2008 are expressly incorporated by reference herein.

BACKGROUND

1. Technical Field

The present invention relates to an actuator device including a piezoelectric element formed of a lower electrode, a piezoelectric layer, and an upper electrode, and displaceably provided on a substrate with a zirconium oxide layer interposed therebetween, the substrate having a silicon oxide layer formed by thermal oxidation on at least a surface thereof, a method of manufacturing the same, and a liquid-jet head including the actuator device as a liquid-jet unit.

2. Related Art

As a piezoelectric element used in an actuator device, there is an element formed by sandwiching a piezoelectric layer made of a piezoelectric material exhibiting an electromechanical conversion function, for example, a crystallized dielectric material, between two electrodes of a lower electrode and an upper electrode. Such an actuator device is generally called a flexure-vibration-mode actuator device and is mounted on and used in a liquid-jet head, for example. Here, a typical example of the liquid-jet head includes an ink-jet recording head, for example, in which a part of a pressure generating chamber communicated with a nozzle orifice for ejecting ink droplets is formed of a vibration plate, and ink droplets are ejected from the nozzle orifice by displacing this vibration plate with a piezoelectric element so as to pressurize the ink in the pressure generating chamber. Meanwhile, as the actuator device to be mounted on the ink-jet recording head, for example, there is a device in which a piezoelectric material layer is formed over the entire surface of the vibration plate by a film-forming technique and this piezoelectric material layer is cut into shapes each corresponding to the pressure generating chamber by a lithography method to form piezoelectric elements provided independent from one another for the respective pressure generating chambers.

As such a piezoelectric element, there is an element formed of a lower electrode, a piezoelectric layer, and an upper electrode, and displaceably provided on a substrate with a zirconium oxide layer interposed therebetween, the substrate having a silicon oxide layer formed by thermal oxidation on a surface thereof (as disclosed in JP-A-2003-110158, JP-A-2005-166719, and JP-A-2005-295786, for example).

Formation of the silicon oxide layer on the surface of the substrate by thermal oxidation prevents pin holes and the like as compared to the case of forming the silicon oxide layer by use of a vapor deposition method such as a CVD method. Moreover, this leads to the formation of a layer formed on the silicon oxide layer which has no pin holes, the layer not being affected by the pin holes, thus eventually obtaining a desired actuator device. Meanwhile, in the liquid-jet head, passages such as the pressure generating chambers are formed by wet-etching the substrate. Here, a silicon oxide layer which has no pin holes is also needed in order to cause the silicon oxide layer to function as an etching stop layer at the time of the wet etching. Accordingly, the silicon oxide layer without pin holes has been obtained by forming the silicon oxide layer by thermal oxidation. Meanwhile, a component constituting the piezoelectric layer is diffused from the piezoelectric layer toward the silicon oxide layer at the time of baking at a high temperature a "precursor film" which is a state of the piezoelectric layer before crystallization. Here, the component diffused from the piezoelectric layer is prevented by the zirconium oxide layer.

However, when the zirconium oxide layer is formed on the silicon oxide layer formed by the above-described thermal oxidation, although there is no effect by the pin holes as very few pin holes exist on the silicon oxide layer, there has been a problem that the zirconium oxide layer having a uniform thickness cannot be formed because part of crystals constituting the zirconium oxide layer have grown abnormally due to a different reason from the effects by the pin holes, whose detailed cause of generation is unknown. As a result, there has been a problem that an actuator device having a desired displacement characteristic cannot be obtained since concave-convex portions formed on the zirconium oxide layer are transmitted to the lower electrode, the piezoelectric layer, and the upper electrode formed on the zirconium oxide layer, and thereby negatively affecting the state of film formation thereof.

SUMMARY

In view of the above-described circumstances, it is an object of the invention to provide an actuator device in which a dense zirconium oxide layer having a uniform thickness is formed by preventing the abnormal growth of zirconium oxide crystals, a method of manufacturing the same, and a liquid-jet head.

An aspect of the invention for solving the above-mentioned problems provides an actuator device including a piezoelectric element formed of a lower electrode, a piezoelectric layer, and an upper electrode, and displaceably provided on a substrate with a zirconium oxide layer interposed therebetween, the substrate having a silicon oxide layer formed by thermal oxidation on at least a surface thereof, in which an intermediate layer made of at least one material selected from the group consisting of titanium oxide, hafnium oxide, aluminum oxide, calcium oxide, and rare earth oxide is provided between the silicon oxide layer and the zirconium oxide layer. In this aspect, an actuator device in which a dense zirconium oxide layer having a uniform thickness is formed can be provided. As a result, it is possible to form dense lower electrode, piezoelectric layer, and upper electrode each having a uniform thickness and thereby to provide an actuator device having a desired displacement characteristic. Moreover, since adhesion between a silicon oxide layer and a zirconium oxide layer can be improved, an actuator device having high durability and reliability can be provided.

Here, it is preferable that the thickness of the intermediate layer be in a range from 5 nm to 50 nm. In this way, the adhesion and density of the intermediate layer can be improved. As a result, it is possible to form denser lower electrode, piezoelectric layer, and upper electrode each having a more uniform thickness, and thereby to provide an actuator device having a desired displacement characteristic easily. Here, if the thickness of the intermediate layer is below 5 nm, an effect of preventing the abnormal growth of part of the crystals constituting the zirconium oxide layer is reduced. Meanwhile, if the thickness of the intermediate layer is above 50 nm, the function of preventing the abnormal growth of part of the crystals constituting the zirconium oxide layer is ensured but there is a possibility of disrupting stress balance among the layers constituting the actuator device.

Further, it is preferable that the intermediate layer be amorphous. In this way, it is possible to prevent a crystalline film formed on the intermediate layer from generating a characteristic change.

Furthermore, it is preferable that the intermediate layer be made of at least one material selected from the group consisting of aluminum oxide, calcium oxide, and rare earth oxide and that, between the intermediate layer and the zirconium oxide layer, a partially stabilized zirconium layer formed by a diffusion reaction therebetween be further provided. In this way, since the partially stabilized zirconium layer having excellent mechanical characteristic and durability is formed between the intermediate layer and the zirconium oxide layer, an actuator device having further excellent mechanical characteristic and durability can be provided.

A further aspect of the invention provides a liquid-jet head including a passage-forming substrate provided with a pressure generating chamber communicated with a nozzle orifice for ejecting a liquid, and any of the above-described actuator devices provided on one surface side of the passage-forming substrate as a pressure generator for generating a pressure change in the pressure generating chamber. In accordance with this aspect, a highly reliable liquid-jet head can be provided.

A still further aspect of the invention provides a method of manufacturing an actuator device including: a piezoelectric element formed of a lower electrode, a piezoelectric layer, and an upper electrode, and displaceably provided on a substrate with a zirconium oxide layer interposed therebetween, the substrate having a silicon oxide layer formed by thermal oxidation on at least a surface; and an intermediate layer made of at least one material selected from the group consisting of titanium oxide, hafnium oxide, aluminum oxide, calcium oxide, and rare earth oxide between the silicon oxide layer and the zirconium oxide layer, the method including the steps of: forming the silicon oxide layer on at least a surface of the substrate by thermal oxidation; forming the intermediate layer on the silicon oxide layer; and forming the zirconium oxide layer on the intermediate layer. In accordance with this aspect, it is possible to manufacture an actuator device in which a dense zirconium oxide layer having a uniform thickness is formed while abnormal growth of crystals constituting the zirconium oxide layer is prevented. As a result, it is possible to form dense lower electrode, piezoelectric layer, and upper electrode each having uniform thickness and thereby to manufacture an actuator device having a desired displacement characteristic.

Here, it is preferable that the intermediate layer be formed of titanium oxide, and that the intermediate layer and the zirconium oxide layer be simultaneously formed by providing a titanium layer on the silicon oxide layer and a zirconium layer on the titanium layer and then by subjecting the titanium layer and the zirconium layer to thermal oxidation at the same time. In this way, it is possible to reduce the number of manufacturing steps and to improve productivity of the actuator device as a consequence.

Meanwhile, it is preferable that, between the intermediate layer and the zirconium oxide layer, a partially stabilized zirconium layer formed by a diffusion reaction therebetween be provided, that the intermediate layer be made of at least one material selected from the group consisting of aluminum oxide, calcium oxide, rare earth oxide, and a combination of these oxides, and that the intermediate layer, the partially stabilized zirconium layer, and the zirconium oxide layer be formed simultaneously by forming a metal layer made of metal constituting the material on the silicon oxide layer and a zirconium layer on the metal layer and then by subjecting the metal layer and the zirconium layer to thermal oxidation at the same time. In this way, since the partially stabilized zirconium layer having further excellent mechanical characteristic and durability can be formed between the intermediate layer and the zirconium oxide layer, an actuator device having excellent mechanical characteristic and durability can be manufactured.

DESCRIPTION OF EXEMPLARY EMBODIMENTS

Detailed descriptions of the invention will be provided below on the basis of the embodiments.

Embodiment 1

Figure 1:
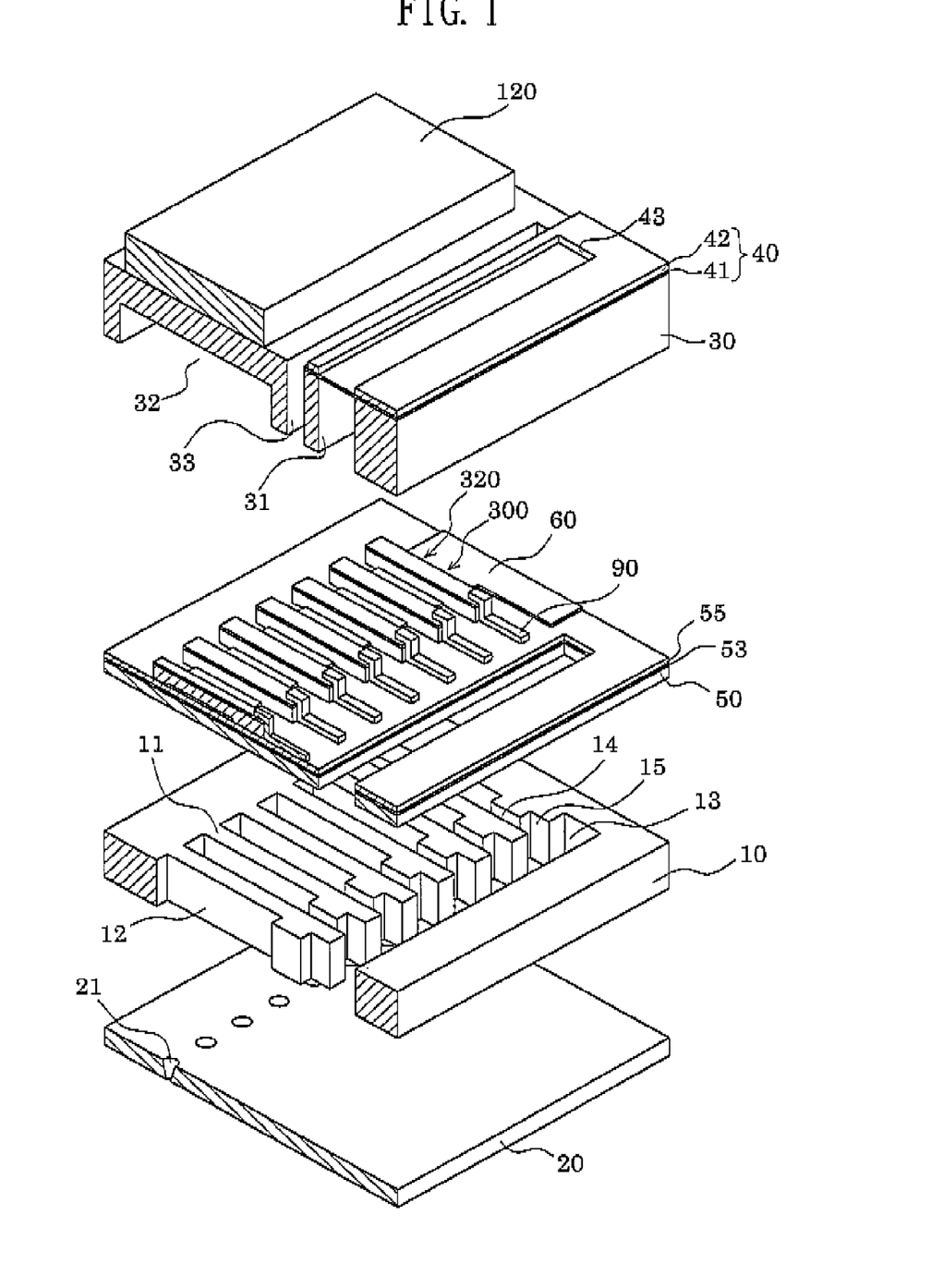
FIG. 1 is an exploded perspective view showing a schematic configuration of a recording head according to Embodiment 1.
Figure 2A:
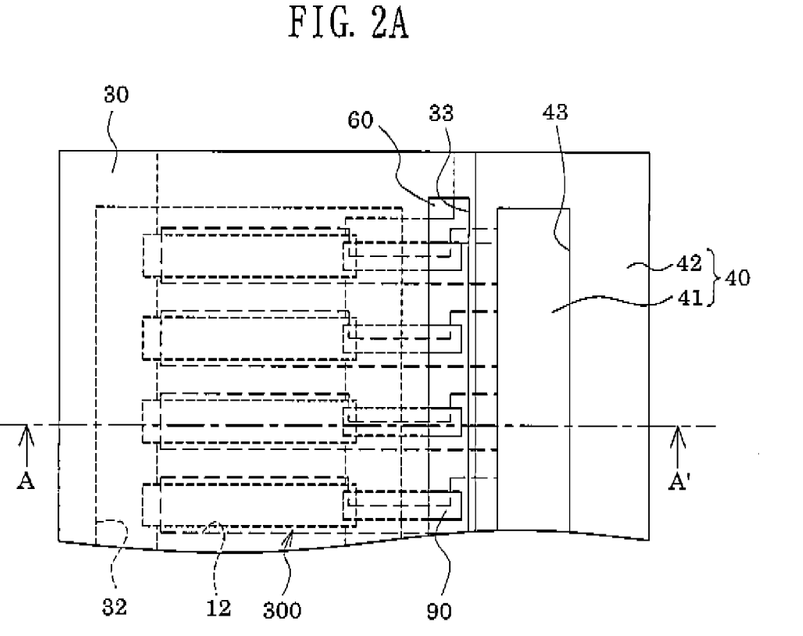
FIG. 2A is a plan view of the recording head according to Embodiment 1 and FIG. 2B is a cross-sectional view of the recording head according to Embodiment 1.
Figure 2B:
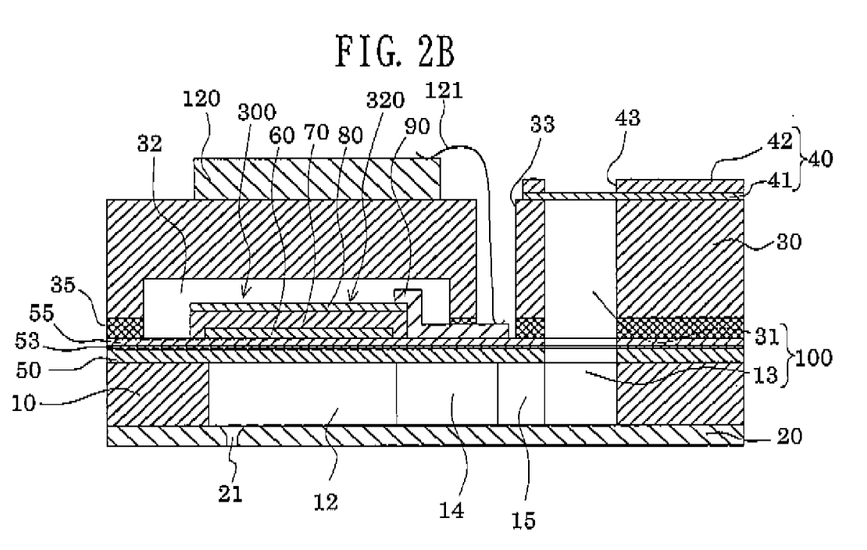

FIG. 1 is an exploded perspective view showing a schematic configuration of an ink-jet recording head representing an example of a liquid-jet head according to Embodiment 1 of the invention and FIGS. 2A and 2B are a plan view of FIG. 1 and an A-A' cross-sectional view thereof.

As shown in the drawings, a passage-forming substrate 10 being a substrate is made of a single crystal silicon substrate having a crystal plane orientation of (110) in this embodiment, and an elastic film 50 made of silicon dioxide ($SiO_2$) representing an example of silicon oxide is formed in advance on one of surfaces of the passage-forming substrate 10 by thermal oxidation.

In the passage-forming substrate 10, pressure generating chambers 12 divided by multiple compartment walls 11 are arranged in parallel in width directions (a lateral direction) thereof by performing anisotropic etching from the other surface side. Meanwhile, ink supply paths 14 and communicating paths 15 are divided by the compartment walls 11 on one end side in a longitudinal direction of the pressure generating chambers 12 in the passage-forming substrate 10. Meanwhile, a communicating portion 13 constituting part of a reservoir 100 being a common ink chamber (a liquid chamber) for the pressure generating chambers 12 is formed on one end of the communication paths 15. In other words, in the passage-forming substrate 10, a liquid passage formed of the pressure generating chambers 12, the communicating portion 13, the ink supply paths 14, and the communicating paths 15 are provided.

The ink supply paths 14 each communicate with one end side in the longitudinal direction of the corresponding pressure generating chamber 12 and have a smaller cross-sectional area than that of the pressure generating chamber 12.

Moreover, a nozzle plate 20 is fixed onto an opening surface of the passage-forming substrate 10 by use of an adhesive agent, a thermal welding film or the like, the nozzle plate 20 being provided with nozzle orifices 21 that are drilled in the nozzle plate 20 so as to communicate with the vicinities of opposite ends to the ink supply paths 14 of the pressure generating chambers 12. Here, the nozzle plate 20 is made of a glass ceramic, a single crystal silicon substrate or a stainless steel, for example.

Meanwhile, the elastic film 50 made of silicon dioxide, which is an example of silicon oxide, is formed on the side opposite to the opening surface of the passage-forming substrate 10 as described previously, and an intermediate film (layer) 53 is provided on this elastic film 50. Here, the silicon oxide denotes a known compound such as $SiO_2$ formed by combining silicon with oxide, and a mixed state thereof.

The intermediate film 53 is made of at least one material selected from the group consisting of titanium oxide, hafnium oxide, aluminum oxide, calcium oxide, and rare metal oxide. In other words, the intermediate film 53 may be made of only one type of these oxides or made of a mixture that combines some of these oxides. Here, the rare earth oxide means compounds of rare earth elements and oxygen, and the rare earth elements include scandium and yttrium in addition to lanthanoid. Moreover, the oxides described above include known compounds formed by combining the metal elements which constitutes the respective oxides with oxygen, and moreover, mixed states thereof. For example, the titanium oxide may be TiO, $Ti_2O_3$, $TiO_2$, $Ti_2O_5$, $TiO_3$, or mixed states thereof. Although details will be described later, by providing the intermediate film 53 made of any of these materials, it is possible to form a dense insulation film 55 having a uniform thickness on this intermediate film 53.

The thickness of this intermediate film 53 is preferably in a range from 5 nm to 50 nm, and particularly preferably in a range from 10 nm to 20 nm. If the thickness of the intermediate film 53 is below 5 nm, it is not possible to form the dense insulation film 55 having the uniform thickness. If the thickness thereof is above 50 nm, adhesion between the elastic film 50 and the insulation film 55 is reduced. Moreover, there is a possibility to disrupt stress balance among the layers constituting the actuator device.

Meanwhile, the intermediate film 53 may be a film having a crystal structure or an amorphous film not having the crystal structure. For example, by providing the amorphous intermediate film 53, there is an effect of preventing a characteristic change in the crystal of the insulation film 55, which is a crystalline film formed on the intermediate film 53. More specifically, when the intermediate film 53 has the crystal structure, there is a possibility that the crystal structure of the intermediate film 53 affects a crystalline film such as the insulation film 55 to be formed on the intermediate film 53, and thereby makes it difficult to form the crystalline film having desired crystallinity on the intermediate film 53.

Moreover, the insulation film 55 being made of zirconium oxide and having a thickness of, for example, about 0.4 μm is stacked on this intermediate film 53. Here, the zirconium oxide denotes a known compound, such as $ZrO_2$, that is formed by combining zirconium with oxide and a mixed state thereof.

Further, a lower electrode film 60, a piezoelectric layer 70 having a thickness ranging from about 1.0 to 5.0 μm, for example, and an upper electrode film 80 are stacked on this insulation film 55 in accordance with processes to be described later, thereby constituting a piezoelectric element 300. Here, the piezoelectric element 300 means a portion including the lower electrode film 60, the piezoelectric layer 70, and the upper electrode film 80. In general, one of the electrodes of the piezoelectric element 300 is used as a common electrode, and the other electrode thereof and the piezoelectric layer 70 are configured by being patterned for each of the pressure generating chambers 12. Here, a portion being formed of any one of the electrodes and the piezoelectric layer 70 that are patterned and generating piezoelectric strain upon application of a voltage to both of the electrodes is called a piezoelectric active portion. In this embodiment, the lower electrode film 60 is used as the common electrode of the piezoelectric element 300 while the upper electrode film 80 is used as an individual electrode of the piezoelectric element 300. However, there is no problem to invert this configuration for a reason attributable to a driving circuit or wiring. Moreover, the piezoelectric element 300 and a vibration plate causing displacement by driving the piezoelectric element 300 will be herein collectively referred to as an actuator device.

Meanwhile, lead electrodes 90 which are drawn from the vicinity of an end on the ink supply path 14 sides and are extended onto the insulation film 55 are connected to the respective upper electrode films 80 constituting the individual electrodes of the piezoelectric elements 300.

A protection plate 30 including a reservoir portion 31 that constitutes at least part of the reservoir 100 is attached onto the passage-forming substrate 10 provided with the above-described piezoelectric elements 300 through an adhesive agent 35. In this embodiment, the reservoir portion 31 is formed across the width directions of the pressure generating chambers 12 so as to penetrate the protection plate 30 in the thickness directions thereof, and communicates with the communicating portion 13 in the passage-forming substrate 10 as described above, thereby constituting the reservoir 100 serving as the common liquid chamber to the pressure generating chambers 12. Alternatively, it is also possible to divide the communicating portion 13 in the passage-forming substrate 10 into multiple pieces to correspond to the pressure generating chambers 12 and to use only the reservoir portion 31 as the reservoir. Further, it is also possible to provide only the pressure generating chambers 12 in the passage-forming substrate 10 and to provide the ink supply paths 14 for establishing communications between the reservoir and the pressure generating chambers 12 on any of the members (such as the elastic film 50 or the insulation film 55) interposed between the passage-forming substrate 10 and the protection plate 30.

Moreover, a piezoelectric element holding portion 32 having an adequate space for not hampering motion of the piezoelectric element 300 is provided in a region facing the piezoelectric elements 300 in the protection plate 30. The protection plate 300 only needs to have adequate space so as not to hamper the motion of the piezoelectric element 300, and the space may be hermetically sealed or not hermetically sealed.

As for the protection plate 30 described above, it is preferable to use a material such as glass or a ceramic material which has substantially the same thermal expansibility as that of the passage-forming substrate 10. In this embodiment, the protection plate 30 is formed by use of a single crystal silicon substrate which is the same material as that of the passage-forming substrate 10.

Meanwhile, the protection plate 30 is provided with a penetrated hole 33 that penetrates the protection plate 30 in the thickness directions. Moreover, the vicinity of the end of the lead electrode 90 drawn from each of the piezoelectric elements 300 is provided so as to be exposed to the inside of the penetrated hole 33.

Further, a driving circuit 120 for driving the piezoelectric elements 300 arranged in parallel is fixed onto the protection plate 30. A circuit plate, a semiconductor integrated circuit (IC), and the like can be used as this driving circuit 120, for example. Moreover, the driving circuit 120 is electrically connected to the lead electrodes 90 through connection wires 121 made of conductive wires such as bonding wires.

Meanwhile, a compliance plate 40 formed of a sealing film 41 and a fixation plate 42 is joined onto the above-described protection plate 30. Here, the sealing film 41 is made of a flexible material having low rigidity and having flexibility (such as a polyphenylene sulfide (PPS) film) and one surface of the reservoir portion 31 is sealed with this sealing film 42. Meanwhile, the fixation plate 42 is formed of a hard material such as metal (stainless steel (SUS), for example). A region of this fixation plate 42 facing the reservoir 100 is formed into an opening portion 43 which is completely removed in the thickness directions. Accordingly, the one surface of the reservoir 100 is sealed only with the sealing film 41 having flexibility.

According to the ink-jet recording head of this embodiment, ink is taken in from an unillustrated external ink supply unit. After filling the inside ranging from the reservoir 100 to the nozzle orifices 21 with the ink, voltage is applied between the respective lower electrode films 60 and upper electrode films 80 corresponding to the pressure generating chambers 12 so as to bring about flexural deformation of the elastic film 50, the intermediate film 53, the insulation film 55, the lower electrode film 60, and the piezoelectric layer 70. Thereby, pressure inside each of the pressure generating chambers 12 is increased and ink droplets are ejected from the corresponding nozzle orifice 21.

Figure 4A:
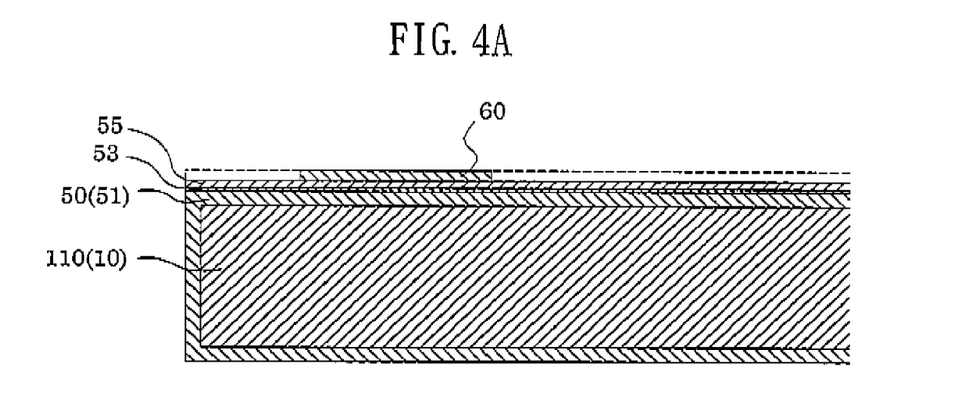
FIGS. 4A to 4C are cross-sectional views each showing the manufacturing step of the recording head according to Embodiment 1.
Figure 4B:
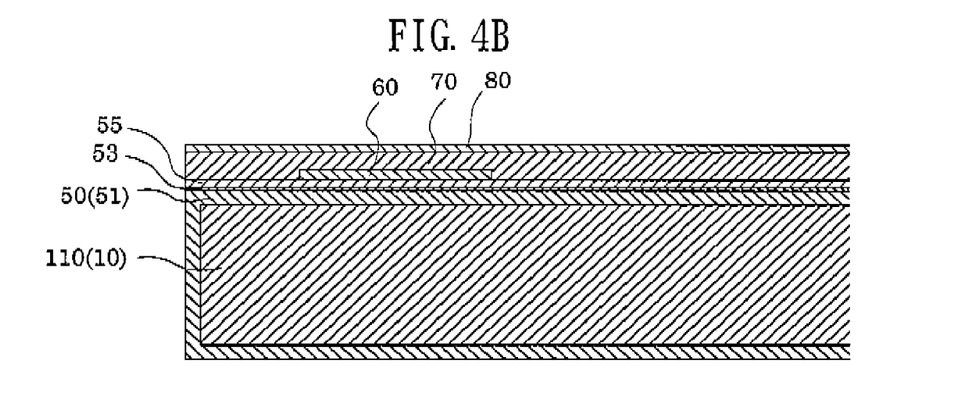
Figure 4C:
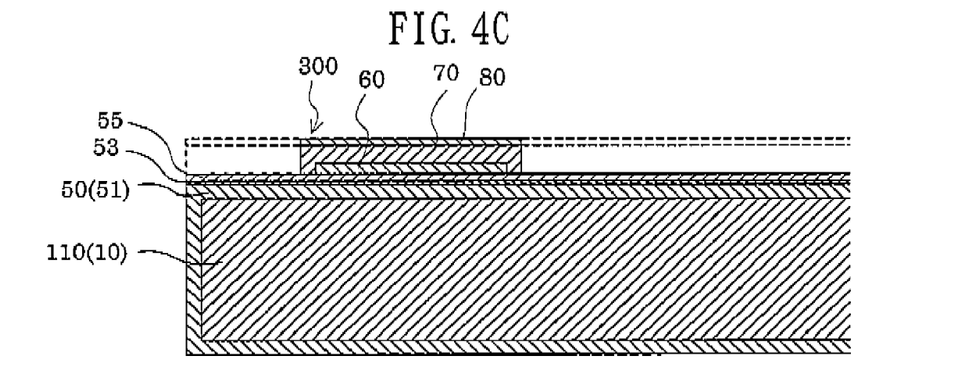
Figure 5A:
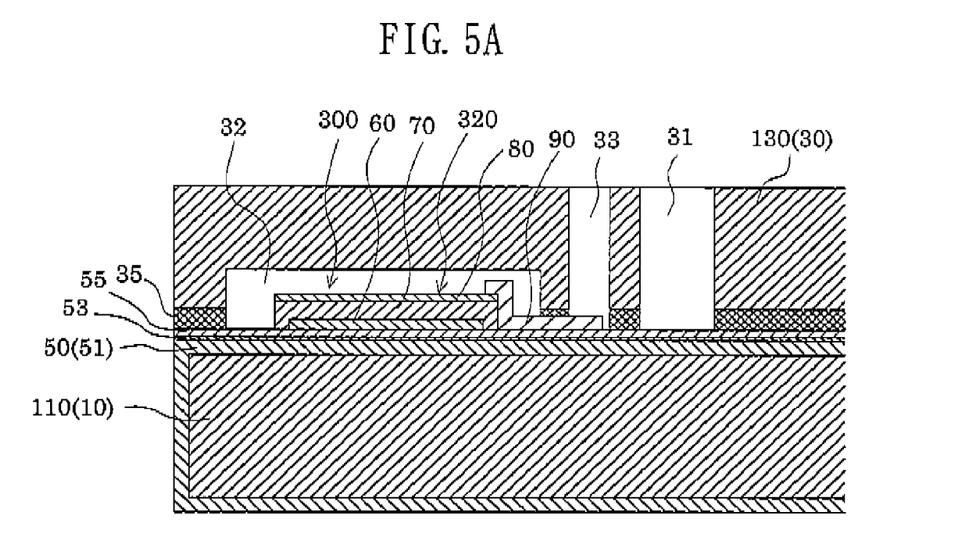
FIGS. 5A and 5B are cross-sectional views each showing the manufacturing step of the recording head according to Embodiment 1.
Figure 5B:
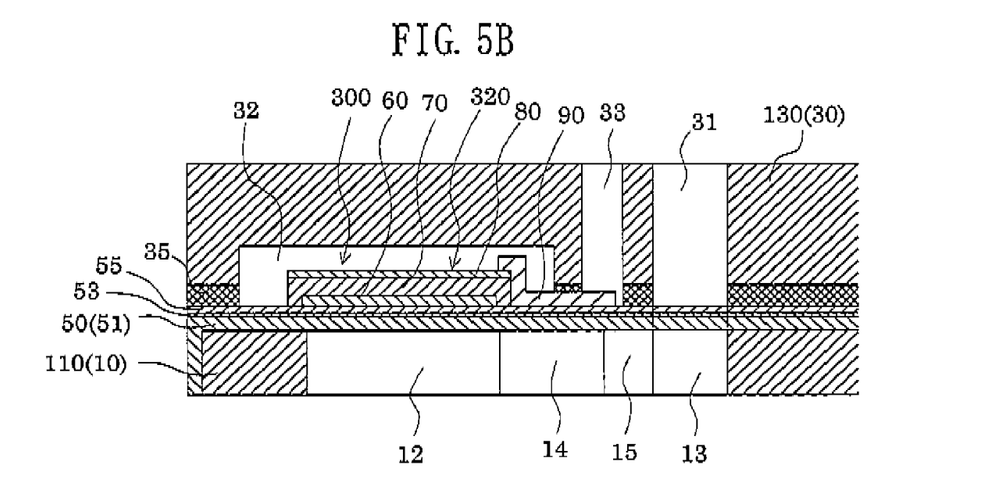

Next, an example of a method of manufacturing the above-described ink-jet recording head will be described with reference to FIG. 3 to FIG. 5. Here, FIG. 3 to FIG. 5 are each a cross-sectional view of a pressure generating chamber in the longitudinal direction showing the method of manufacturing the ink-jet recording head representing an example of the liquid-jet head according to Embodiment 1 of the invention.

Figure 3A:
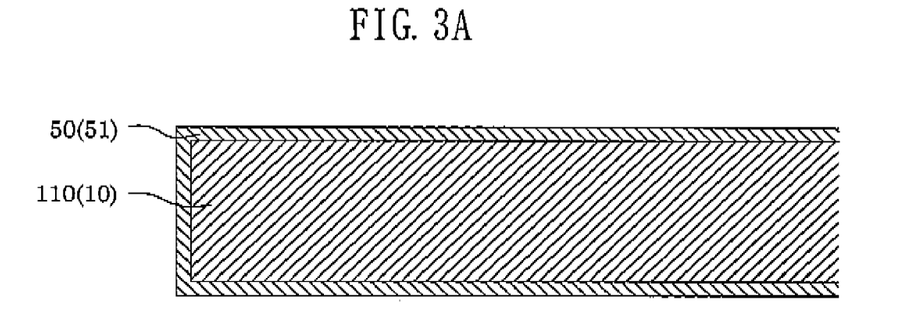
FIGS. 3A to 3D are cross-sectional views each showing a manufacturing step of the recording head according to Embodiment 1.

First, as shown in FIG. 3A, a surface of a passage-forming substrate wafer 110, which is a silicon wafer, is subjected to thermal oxidation to form a silicon dioxide film 51 made of silicon dioxide ($SiO_2$) that constitutes the elastic film 50 on the surface of the passage-forming substrate wafer 110.

Figure 3B:
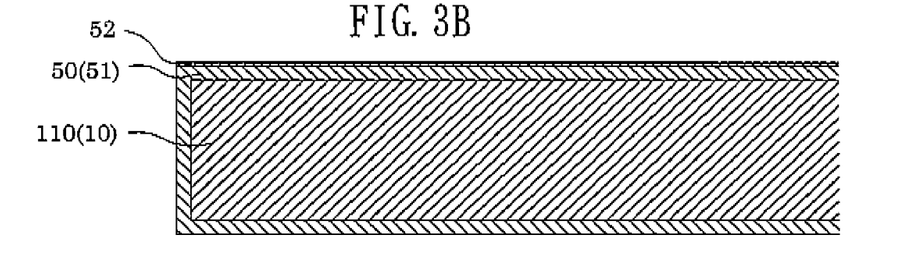

Subsequently, as shown in FIG. 3B, a Ti film (layer) 52, which is a metal layer, made of titanium metal is formed on the elastic film 50 (the silicon dioxide film 51) by sputtering.

Figure 3C:
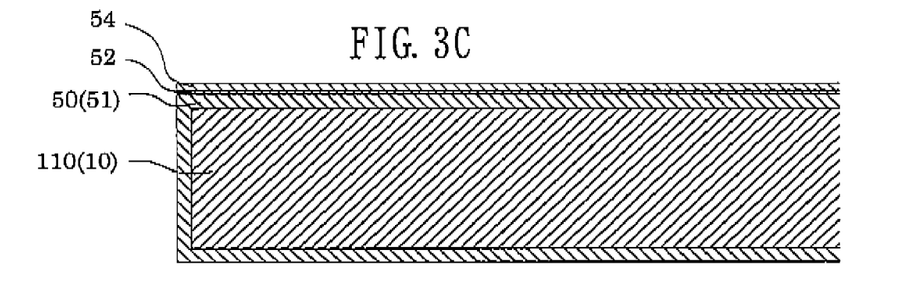

Next, as shown in FIG. 3C, a Zr film (layer) 54 made of zirconium metal is formed on the Ti film 52 by sputtering. To be more precise, the Zr film 54 is formed by using a DC sputtering method and adjusting balance among respective conditions within ranges of film forming temperature from room temperature (23° C.) to 100° C., Ar pressure at the time of film formation from 0.02 Pa to 1.0 Pa, and output power density from 3 kW/m$^2$ to 30 kW/m$^2$.

Figure 3D:
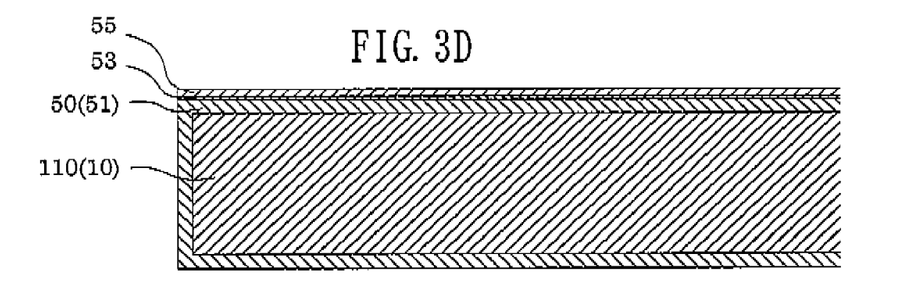

Then, the Ti film 52 and the Zr film 54 are subjected to thermal oxidation in a diffusion furnace at a temperature in a range from 500° C. to 1200° C. Accordingly, the intermediate film 53 made of titanium oxide ($TiO_2$) and the insulation film 55 made of zirconium oxide ($ZrO_2$) are simultaneously formed on the silicon dioxide film 51 as shown in FIG. 3D.

Here, as the Zr film 54 is formed on the Ti film 52, it is possible to form the dense insulation film 55 having the uniform thickness while abnormal growth of zirconium oxide crystals that constitute the insulation film 55 is prevented at the time of the thermal oxidation, and to improve adhesion between the elastic film 50 and the insulation film 55 by way of the formed intermediate film 53.

On the contrary, if the Zr film is formed directly on the elastic film and the insulation film is formed by subjecting the Zr film to thermal oxidation, some of the zirconium oxide crystals are abnormally grown at the time of the thermal oxidation and there arises a problem that it is not possible to form the insulation film having the uniform thickness. Nevertheless, in this embodiment, there is no concern over such a problem.

Note that, in this embodiment, the intermediate film 53 and the insulation film 55 are formed by forming the Zr film 54 on the Ti film 52 and then by subjecting the Ti film 52 and the Zr film 54 to thermal oxidation by way of heating. However, the invention is not particularly limited to this configuration. For example, it is possible to form zirconium oxide directly by the sputtering method or the like without performing thermal treatment to form the insulation film 55. In this way, by forming the insulation film 55 directly without performing the thermal treatment, it is possible to form the amorphous intermediate film 53 as a foundation thereof. In other words, when the insulation film 55 is formed by the thermal treatment, the intermediate film 53 being a foundation thereof is simultaneously heated. Accordingly, even if the amorphous intermediate film 53 is formed, the intermediate film 53 is crystallized later when the insulation film 55 is formed.

On the contrary, when the insulation film 55 made of zirconium oxide is formed directly without performing the thermal treatment, even if the amorphous intermediate film 53 is formed in advance as the foundation thereof, the intermediate film 53 is not subjected to the thermal treatment and thus is not crystallized when the insulation film 55 is formed. Note that the piezoelectric layer 70 is formed by a thermal treatment after the insulation film 55 is formed in accordance with a manufacturing method to be described later. However, since the intermediate film 53 is covered with the insulation film 55, the intermediated film 53 is not crystallized by the thermal treatment for the piezoelectric layer 70. Moreover, a temperature of the thermal treatment for forming the piezoelectric film 70 is lower than a temperature at the time of subjecting zirconium to the thermal oxidation to form the insulation film 55 made of zirconium oxide. Hence, crystallization of the intermediate film 53 is also prevented by this aspect.

Incidentally, the amorphous intermediate film 53 can be formed in accordance with a sputtering method, an RF sputtering method, a vapor deposition method such as a CVD method or an electron beam vapor deposition method, an ion plating method, and the like. Here, it is possible to apply an appropriate manufacturing method by which a relatively dense film can be formed in response to the above-mentioned materials used for the intermediate film 53. For example, the CVD method is preferable in the case of using aluminum oxide as the intermediate film 53 while the sputtering method is preferable in the case of using titanium oxide.

Subsequently, as shown in FIG. 4A to FIG. 4C, the lower electrode film 60 and the upper electrode film 80 are formed on the passage-forming substrate 10 by using the sputtering method or the like and the piezoelectric layer 70 is formed thereon by using a thin film forming technique such as a sol-gel method, an MOD (metal-organic decomposition) method or the sputtering method, for example, and then the piezoelectric elements 300 are formed in regions facing the respective pressure generating chambers by patterning. Here, as the lower electrode film 60 is formed on the dense insulation film 55 having the uniform thickness, the lower electrode film 60 also becomes the dense film having a uniform thickness similarly. Thus, it is possible to manufacture the piezoelectric layer 70 having a desired piezoelectric characteristic easily. Moreover, since the piezoelectric layer 70 and the upper electrode film 80 are sequentially formed on the dense film having the uniform thickness, those films also become the dense films having uniform thicknesses. As a result, it is possible to manufacture the actuator device having a desired displacement characteristic.

Then, after the lead electrode 90 is formed, as shown in FIG. 5A, the protection plate 30 that holds the patterned multiple piezoelectric elements 300 is joined onto the passage-forming substrate 10 by using the adhesive agent 35. Here, the reservoir portion 31, the piezoelectric element holding portion 32, and the like are formed on the protection plate 30 in advance.

Subsequently, as shown in FIG. 5B, the pressure generating chambers 12, the communicating portion 13, the ink supply paths 14, the communicating paths 15, and the like are formed on the passage-forming substrate 10.

Thereafter, the nozzle plate 20 including the drilled nozzle orifices 21 is joined to the passage-forming substrate 10 on the surface opposite to the protection plate 30, and the compliance plate 40 is joined to the protection plate 30, thereby fabricating the ink-jet recording head having the above-described structure.

As described above, according to the method of manufacturing an actuator device of this embodiment, it is possible to manufacture the actuator device provided with the dense insulation film 55 having the uniform thickness while abnormal growth of the zirconium oxide crystals that constitute the insulation film 55 is prevented. As a result, it is possible to form the dense lower electrode 60, piezoelectric layer 70, and upper electrode 80 having the uniform thicknesses, and thereby to manufacture the actuator device having the desired displacement characteristic. Moreover, since it is possible to improve adhesion between the elastic film 50 and the insulation film 55, it is possible to provide the actuator device having high durability and reliability.

Embodiment 2

In Embodiment 1, the Ti film 52 and the Zr film 54 are formed on the elastic film 50 so that the intermediate film 53 and the insulation film 55 can be formed simultaneously by subjecting those films to thermal oxidation. Instead, it is also possible to form the intermediate layer made of titanium oxide on the elastic film 50, then to form the Zr film 54, and then to form the insulation film 55 by subjecting the Zr film 54 to thermal oxidation.

To be more precise, the intermediate film 53 may be formed directly on the elastic film 50 by using sputtering. Alternatively, the intermediate layer 53 is formed by coating a compound containing Ti onto the elastic film 50 by using the sol-gel method and the MOD (metal-organic decomposition) method, and then subjecting those films to oxidation by way of heating. Then, after the Zr film 54 is formed by sputtering or the like, the insulation film 55 is formed by thermal oxidation. In this way, it is also possible to obtain similar effects to those of Embodiment 1.

Needless to say, in this embodiment, it is also possible to directly form the intermediate film 53 made of titanium oxide, for example, and then to form the insulation film 55 made of zirconium oxide directly without performing a thermal treatment as similar to Embodiment 1. As described above, by directly forming the insulation film 55 without performing a thermal treatment, it is possible to form the amorphous intermediate film 53 serving as the foundation thereof.

Embodiment 3

Although the intermediate film 53 made of titanium oxide is provided between the elastic film 50 and the insulation film 55 in the above-described embodiments, it is also possible to provide an intermediate layer made of at least one material selected from the group consisting of, for example, aluminum oxide ($Al_2O_3$), yttrium oxide ($Y_2O_3$), and lanthanoid oxide including cerium oxide ($CeO_2$), and to provide a partially stabilized zirconium film (layer) between the intermediate layer and the insulation film made of zirconium oxide, which is formed by a diffusion reaction therebetween.

Figure 6:
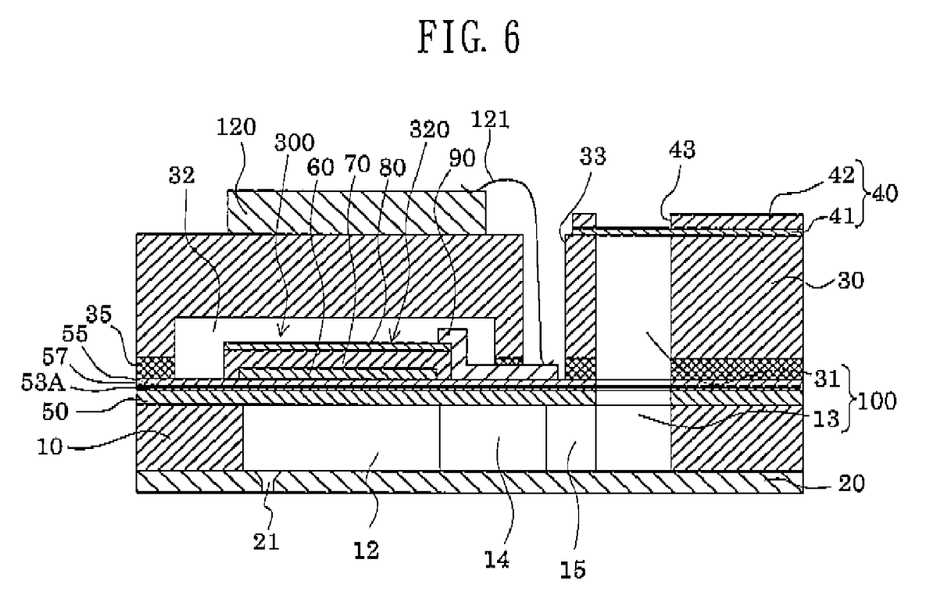
FIG. 6 is a cross-sectional view of a recording head according to Embodiment 3.

To be more precise, as shown in FIG. 6, it is possible to provide an intermediate film 53A made of any of the above-described materials and a partially stabilized zirconium film 57 between the elastic film 50 and the insulation film 55. In this way, by providing the partially stabilized zirconium film 57 having excellent mechanical characteristic and durability between the intermediate film 53A and the insulation film 55, it is possible to provide an actuator device having further excellent mechanical characteristic and durability as will be described later, in addition to the similar effects to those of Embodiment 1. Here, other constituents of the ink-jet recording head according to this embodiment are similar to those in the ink-jet recording head according to Embodiment 1. Accordingly, the same reference numerals are assigned and explanation thereof will be omitted.

Next, an example of a method of manufacturing the ink-jet recording head according to this embodiment will be described. Here, in this manufacturing method, the processes other than the process to form the intermediate film 53A, the partially stabilized zirconium film 57 and the insulation film 55 are also the same as those in the method of manufacturing the ink-jet recording head of Embodiment 1. Accordingly, this process will only be described in the following with reference to FIG. 7. Incidentally, FIG. 7 are each a cross-sectional view of the pressure generating chamber in the longitudinal direction showing the method of manufacturing an ink-jet recording head representing an example of a liquid-jet head according to Embodiment 3 of the invention.

Figure 7A:
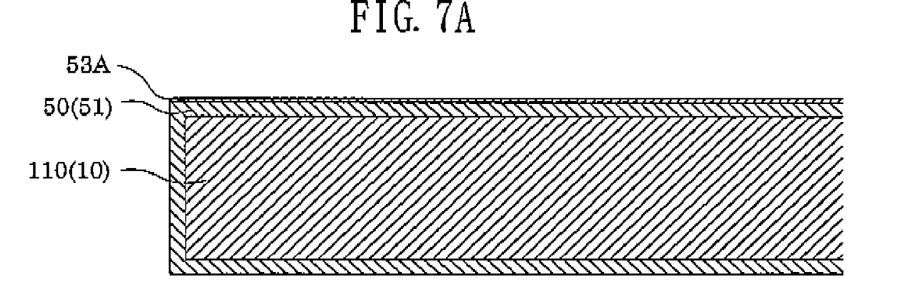
FIGS. 7A to 7C are cross-sectional views each showing a manufacturing step of the recording head according to Embodiment 3.
Figure 7B:
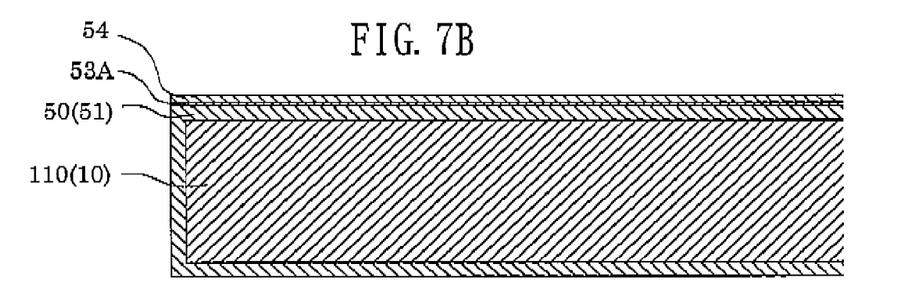

First, as shown in FIG. 7A, the intermediate film 53A made of aluminum oxide is formed by sputtering, for example, on the elastic film 50 provided with the silicon oxide film 51 formed by thermal oxidation. Next, as shown in FIG. 7B, the Zr film 54 made of zirconium metal is formed on the intermediate film 53A in a similar manner to that in Embodiment 1.

Figure 7C:
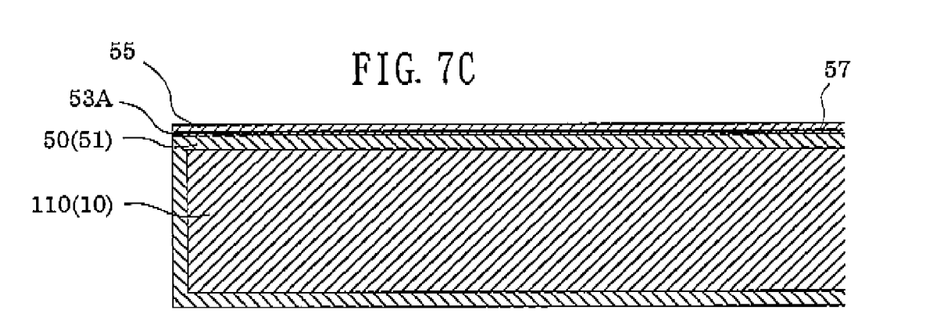

Thereafter, by subjecting this Zr film 54 to thermal oxidation in a diffusion furnace at a temperature from 500° C. to 1200° C., the insulation film 55 made of zirconium oxide is formed as shown in FIG. 7C. Here, during this thermal oxidation, a diffusion reaction occurs between the intermediate film 53A and the insulation film 55, whereby the partially stabilized zirconium film 57 made of partially stabilized zirconium is formed between the intermediate film 53A and the insulation film 55. Specifically, by performing the thermal oxidation on the Zr film 54 which is made of zirconium metal and formed on the intermediate film 53A made of aluminum oxide, the three-layer structured films are formed by sequentially stacking the intermediate film 53A made of aluminum oxide, the partially stabilized zirconium film 57 made of partially stabilized zirconium, and the insulation film 55 made of zirconium oxide.

Here, the Zr film 54 is formed on the intermediate film 53A. Accordingly, it is possible to form the dense insulation film 55 having the uniform thickness while abnormal growth of the zirconium oxide crystals is prevented when the film is subjected to thermal oxidation. Moreover, it is possible to form the partially stabilized zirconium film 57 having excellent mechanical characteristic and durability between the intermediate film 53A and the insulation film 55 at the same time. As a result, in addition to the effects similar to those in Embodiment 1, it is possible to manufacture the actuator device having excellent mechanical characteristic and durability.

Needless to say, in this embodiment, it is also possible to directly form the intermediate film 53A made of aluminium oxide, for example, and then to form the insulation film 55 made of zirconium oxide directly without performing a thermal treatment as similar to Embodiment 1. As described above, by directly forming the insulation film 55 without performing a thermal treatment, it is possible to form the amorphous intermediate film 53A serving as the foundation thereof.

Other Embodiments

In the above-described Embodiment 1, the ink-jet recording head has been explained as an example of the liquid-jet head including the actuator device. However, the invention is intended for encompassing a broad range of liquid-jet heads and is naturally applicable to liquid-jet heads jetting liquids other than the ink. For example, such other liquid-jet heads include various recording heads used for image printing devices such as printers, color material-jet heads used for manufacturing color filters of liquid crystal displays and the like, electrode material-jet heads used for forming electrodes in organic EL displays or FEDs (field emitting displays), bioorganic material-jet heads used for manufacturing biochips, and so forth.

Note that titanium oxide is used as the material for forming the intermediate film 53 in Embodiment 1. However, it is possible to use hafnium oxide ($HfO_2$) instead of titanium oxide. By using hafnium oxide as the material for forming the intermediate film 53, it is possible to reduce the film thickness of the intermediate film 53 as compared to the case of using titanium oxide.

Further, in Embodiment 3, the intermediate film 53A, the partially stabilized zirconium film 57, and the insulation film 55 are formed by forming the intermediate film 53A directly on the elastic film 50, and then by forming the Zr layer 54, and then by subjecting the layer to oxidation by way of heating. Instead, it is also possible to form the intermediate film 53A, the partially stabilized zirconium film 57, and the insulation film 55 at the same time by sequentially stacking an Al layer made of aluminum metal and the Zr layer on the elastic film 50 and then by subjecting those layers to oxidation by way of heating. In this way, it is possible to reduce the number of manufacturing steps and to improve productivity of the actuator device as a consequence.

Moreover, without limitations to the actuator devices to be mounted on the liquid-jet heads, the invention is also applicable to actuator devices to be mounted on other devices.

What is claimed is:

1. An actuator device comprising:
a piezoelectric element formed of a lower electrode, a piezoelectric layer, and an upper electrode, and displaceably provided on a substrate with a zirconium oxide layer interposed therebetween, the substrate including a silicon oxide layer formed by thermal oxidation on at least a surface thereof; and
an intermediate layer made of at least one material selected from the group consisting of titanium oxide, hafnium oxide, aluminum oxide, calcium oxide, and rare earth oxide, and provided between the silicon oxide layer and the zirconium oxide layer.

2. The actuator device according to claim 1, wherein the thickness of the intermediate layer is in a range from 5 nm to 50 nm.

3. The actuator device according to claim 1, wherein the intermediate layer is amorphous.

4. The actuator device according to claim 1, wherein
the intermediate layer is made of at least one material selected from the group consisting of aluminum oxide, calcium oxide, and rare earth oxide, and
between the intermediate layer and the zirconium oxide layer, a partially stabilized zirconium layer formed by a diffusion reaction therebetween is provided.

5. A liquid-jet head comprising:
a passage-forming substrate provided with a pressure generating chamber communicated with a nozzle orifice for ejecting a liquid; and
the actuator device according to claim 1 provided on one surface side of the passage-forming substrate as a pressure generator for generating a pressure change in the pressure generating chamber.

6. A liquid-jet head comprising:
a passage-forming substrate provided with a pressure generating chamber communicated with a nozzle orifice for ejecting a liquid; and
the actuator device according to claim 2 provided on one surface side of the passage-forming substrate as a pressure generator for generating a pressure change in the pressure generating chamber.

7. A liquid-jet head comprising:
a passage-forming substrate provided with a pressure generating chamber communicated with a nozzle orifice for ejecting a liquid; and
the actuator device according to claim 3 provided on one surface side of the passage-forming substrate as a pressure generator for generating a pressure change in the pressure generating chamber.

8. A liquid-jet head comprising:
a passage-forming substrate provided with a pressure generating chamber communicated with a nozzle orifice for ejecting a liquid; and
the actuator device according to claim 4 provided on one surface side of the passage-forming substrate as a pressure generator for generating a pressure change in the pressure generating chamber.

* * * * *